(12) United States Patent
Chen et al.

(10) Patent No.: US 7,365,997 B2
(45) Date of Patent: Apr. 29, 2008

(54) SYNCHRONOUS SWITCHING CONTROL CIRCUIT FOR POWER CONVERTERS

(75) Inventors: Cheng-Sung Chen, Dadu Township, Taichung County (TW); Ta-Yung Yang, Milpitas, CA (US); Rui-Hong Lu, Shueishang Township, Chiayi County (TW)

(73) Assignee: System General Corp., Taipei Hsien (TW)

( * ) Notice: Subject to any disclaimer, the term of this patent is extended or adjusted under 35 U.S.C. 154(b) by 1 day.

(21) Appl. No.: 11/357,044

(22) Filed: Feb. 21, 2006

(65) Prior Publication Data

US 2007/0200633 A1    Aug. 30, 2007

(51) Int. Cl.
*H02M 3/335* (2006.01)

(52) U.S. Cl. ............... 363/21.1; 323/282; 323/284; 323/244; 363/21.08; 363/79; 363/80; 363/97

(58) Field of Classification Search ............ 363/79, 363/80, 97, 21.1, 21.08; 323/244, 282, 284
See application file for complete search history.

(56) References Cited

U.S. PATENT DOCUMENTS 4,073,003 A * 2/1978 Chambers ............... 363/20
4,073,004 A * 2/1978 Chambers et al. ....... 363/79
5,173,847 A * 12/1992 Suzuki .................. 363/21.14
5,615,093 A * 3/1997 Nalbant ................... 363/25
5,903,452 A * 5/1999 Yang ....................... 363/97
5,929,618 A * 7/1999 Boylan et al. ........... 323/282
6,545,882 B2 * 4/2003 Yang .................... 363/21.08
6,781,356 B1 * 8/2004 Yang et al. .............. 323/282

* cited by examiner

*Primary Examiner*—Joseph Chang
(74) *Attorney, Agent, or Firm*—Rosenberg, Klein & Lee

(57) ABSTRACT

The present invention provides a synchronous switching control circuit for variable switching frequency power converters. It comprises a first circuit to generate a first signal in response to an input synchronous signal of a power converter. A second circuit is coupled to the first circuit to generate a second signal in accordance with the frequency of the first signal. Only when the first signal is operated in a specific frequency range, the synchronous operation is allowed. An oscillation circuit is connected to the first circuit and the second circuit to receive the first signal and the second signal to generate an oscillation signal. The oscillation signal is utilized to enable the switching signal of the power converter. The switching signal is thus synchronized with the input synchronous signal in response to the enable of the second signal. Otherwise, the switching signal will be free running.

8 Claims, 8 Drawing Sheets

SYNCHRONOUS SWITCHING CONTROL CIRCUIT FOR POWER CONVERTERS

BACKGROUND OF THE INVENTION

1. Field of Invention

The present invention relates in general to power converters, and more particularly, to the control circuit of switching power converters.

2. Description of Related Art

Power converters have been used to convert an unregulated power source to a regulated voltage and/or a current source. The control circuit of the power converter generates a switching signal for the regulation. The duty cycle of the switching signal is modulated in accordance with the output of the power converter. The switching frequency of the switching signal generally is self-determining in the control circuit of the power converter. Therefore, the synchronization of the switching signal is required to reduce the switching noise and EMI (electrical and magnetic interference) while more than one switching power converters are used in a system. However, in recent development, many PWM (pulse width modulation) control circuits have been proposed for power converters to save power losses, such as "PWM controller having off-time modulation for power converter" by Yang, U.S. Pat. No. 6,545,882; "PWM controller having a modulator for saving power and reducing acoustic noise" by Yang, et al, U.S. Pat. No. 6,781,356. The switching frequency of these prior arts is varied in response to the change of the load, which causes the difficult for the control circuit to synchronize the switching signal with other power converters.

The objective of the present invention is to provide a synchronous switching control circuit to synchronize the switching signal for variable switching frequency power converters.

SUMMARY OF THE INVENTION

The present invention provides a synchronous switching control circuit for variable switching frequency power converters. It comprises a first circuit to generate a first signal in response to an input synchronous signal of a power converter. A second circuit is coupled to the first circuit to generate a second signal in accordance with the frequency of the first signal. The enable of the second signal indicates the first signal is operated in a specific frequency range, which the synchronous operation is allowed. An oscillation circuit is connected to the first circuit and the second circuit to receive the first signal and the second signal to generate an oscillation signal. The oscillation signal is utilized to enable a switching signal of the power converter. The switching signal is thus synchronized with the input synchronous signal in response to the enable of the second signal. Otherwise, the switching signal will be free running.

BRIEF DESCRIPTION OF ACCOMPANIED DRAWINGS

The accompanying drawings are included to provide a further understanding of the present invention, and are incorporated in and constitute a part of this specification. The drawings illustrate embodiments of the present invention and, together with the description, serve to explain the principles of the present invention.

Figure 9A:
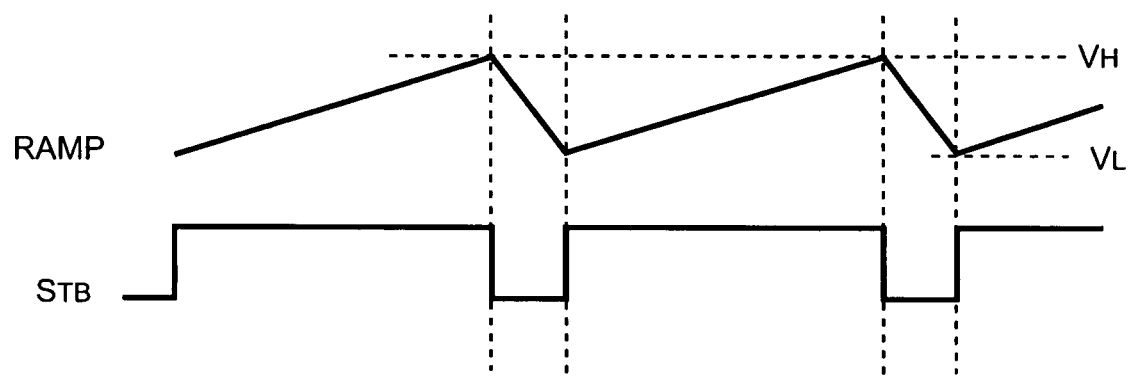
FIG. 9A shows the waveforms of the ramp signal RAMP and the oscillation signal $S_{TB}$ under the switching signal is free running.
Figure 9B:
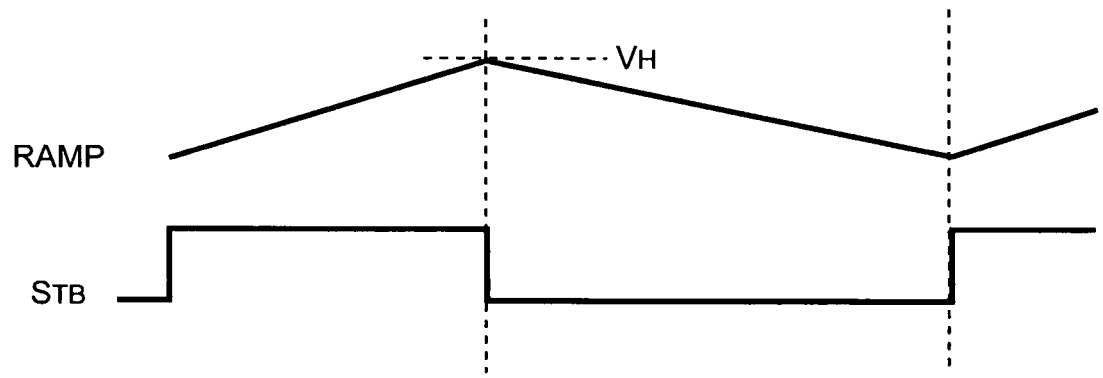
FIG. 9B shows the waveforms of the ramp signal RAMP and the oscillation signal $S_{TB}$ under the switching signal is free running in the power converter operated at the power saving mode.
Figure 9C:
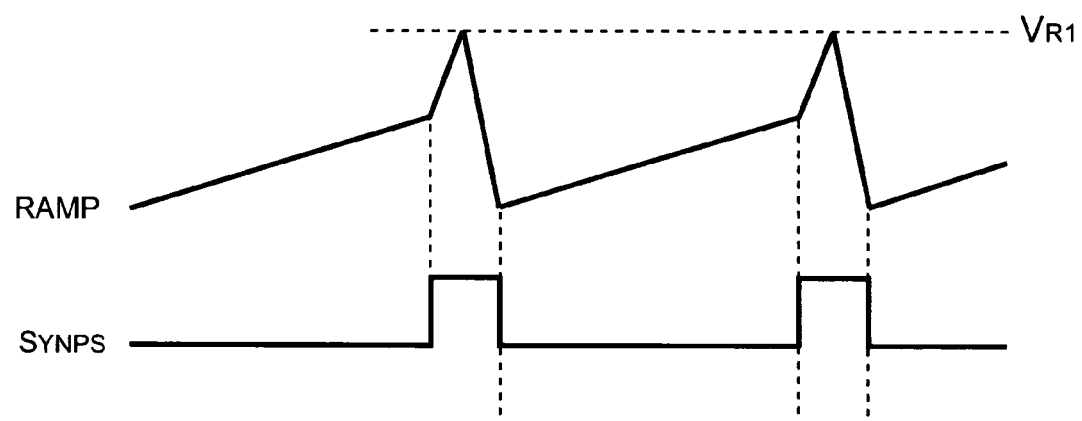
Figure 9D:
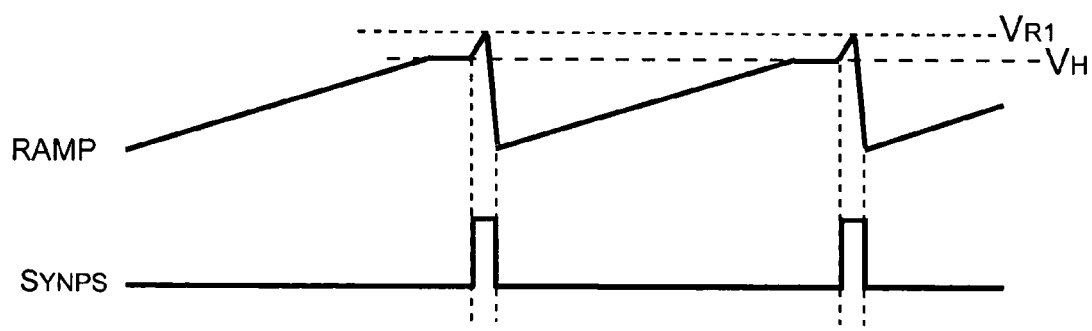

FIG. 9C shows the waveforms of the ramp signal RAMP and the sync-discharge signal $S_{YNPS}$ under the switching signal is synchronized with the input synchronous signal; and FIG. 9D shows the waveforms of the ramp signal RAMP and the sync-discharge signal $S_{YNPS}$ under the switching signal is synchronized with the input synchronous signal in the power converter operated at the power saving mode.

DESCRIPTION OF THE PREFERRED EMBODIMENT

Figure 1:
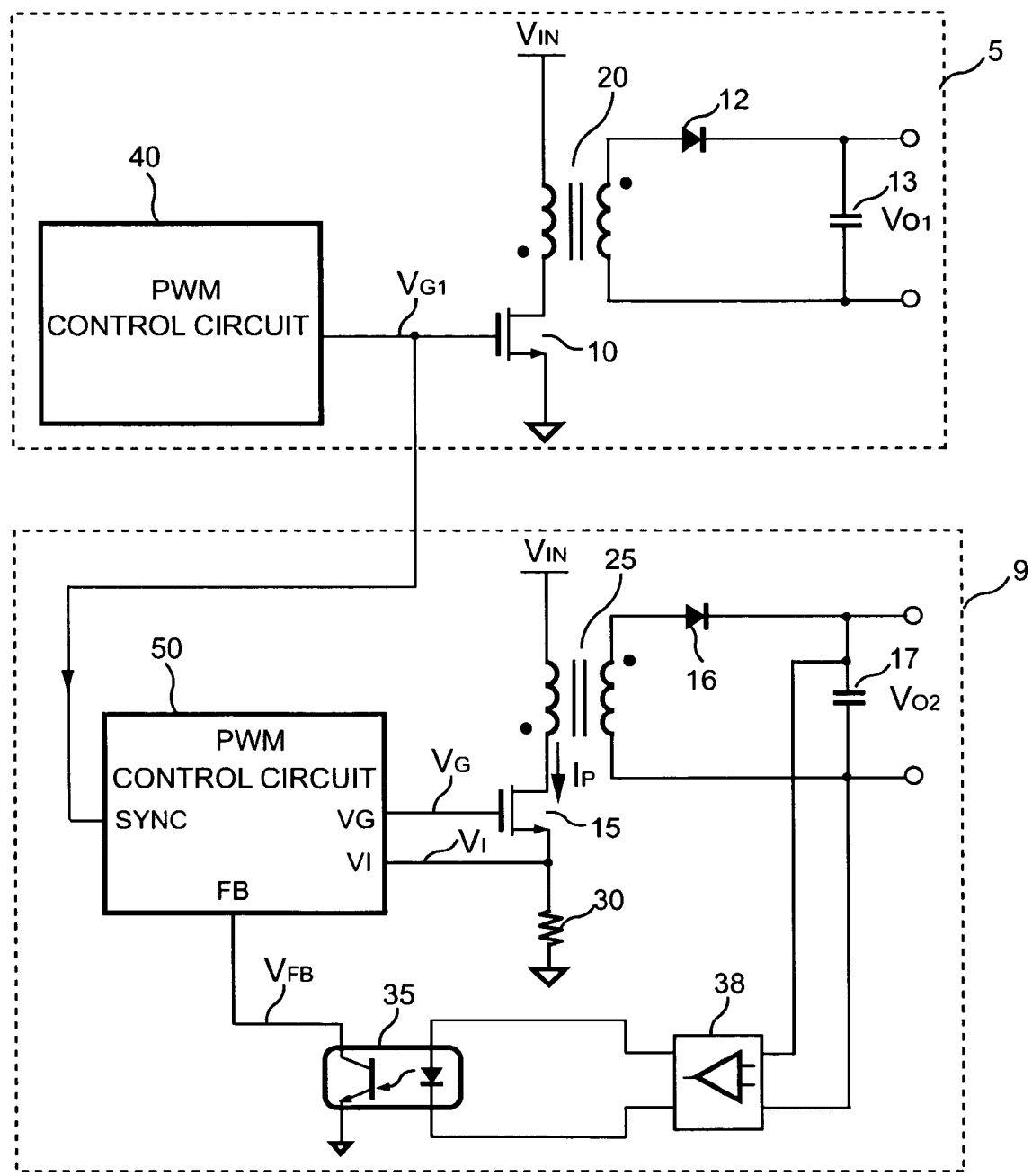
FIG. 1 shows a circuit diagram includes two power converters having synchronous switching according to one embodiment of the present invention.

FIG. 1 shows a circuit diagram includes two power converters having synchronous switching. A first power converter 5 includes a transformer 20 coupled between an input voltage $V_{IN}$ and a ground to generate an output voltage $V_{O1}$. A transistor 10 is connected in series with the primary side of the transformer 20 and the ground. A rectifier 12 is coupled to the secondary side of the transformer 20. A filter capacitor 13 is coupled to the rectifier 12 and the secondary side of the transformer 20. A PWM control circuit 40 of the first power converter 5 generates a switching signal $V_{G1}$ transmitted to the transistor 10 to switch the transformer 20 and regulate the output voltage $V_{O1}$. Meanwhile, the switching signal $V_{G1}$ is transmitted to a synchronous input terminal SYNC of a PWM control circuit 50 of a second power converter 9 for the synchronous switching.

A transformer 25 of the second power converter 9 is coupled between the input voltage $V_{IN}$ and the ground to generate another output voltage $V_{O2}$. The transformer 5 is further connected in series with a transistor 15. A resistor 30 is connected to the transistor 15 to generate a current signal $V_1$ by detecting a switching current $I_P$ of the transformer 25. The current signal $V_1$ is transmitted to a current sense input terminal VI of the PWM control circuit 50. The secondary side of the transformer 25 is coupled to a rectifier 16 and a filter capacitor 17. The filter capacitor 17 is connected in series with the rectifier 16. An error amplifier 38 is coupled to the output terminal of the second power converter 9. The output terminal of the error amplifier 38 is coupled to an optical coupler 35. The output terminal of the optical coupler 35 generates a feedback signal $V_{FB}$. A feedback input terminal FB of the PWM control circuit 50 is coupled to the optical coupler 35 to receive the feedback signal $V_{FB}$. The feedback input terminal FB is coupled to the output terminal of the second power converter 9 through the optical coupler 35 and the error amplifier 38. In accordance with the feedback signal $V_{FB}$ in the feedback input terminal FB, an output terminal VG of the PWM control circuit 50 will generate a switching signal $V_G$ to switch the transformer 25 and regulate the output voltage $V_{O2}$ through the transistor 15. The switching of the switching signal $V_G$ is synchronized with the switching signal $V_{G1}$.

Figure 2:
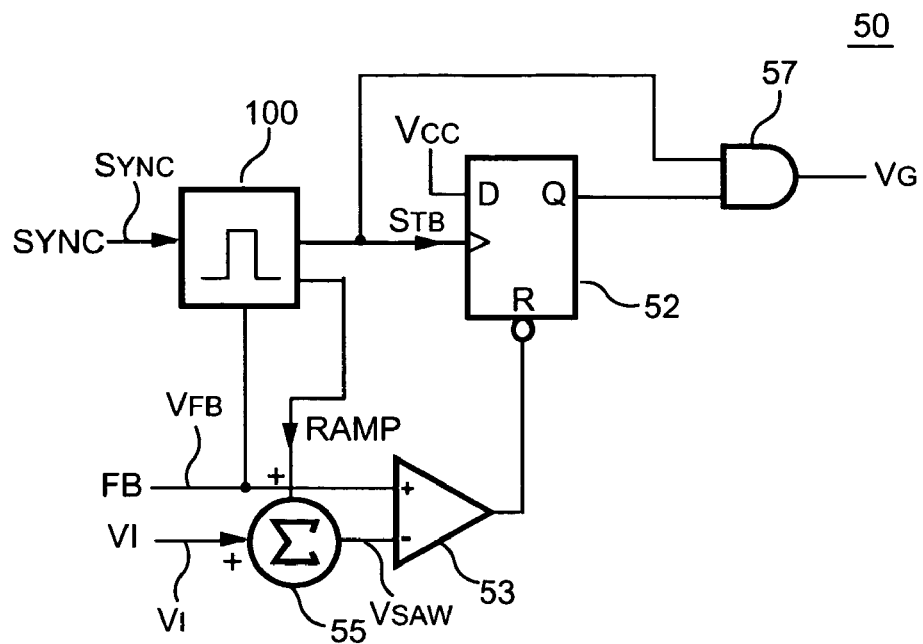
FIG. 2 shows a circuit diagram of a PWM control circuit according to one embodiment of the present invention.

The circuit diagram of the PWM control circuit 50 is shown in FIG. 2. It comprises a synchronous switching control circuit 100 coupled to the synchronous input terminal SYNC and the feedback input terminal FB of the PWM control circuit 50 for generating a ramp signal RAMP and an oscillation signal $S_{TB}$ in response to the switching signal $V_{G1}$. The switching signal $V_{G1}$ is an input synchronous signal $S_{YNC}$. An AND gate 57 is applied to generate the switching signal $V_G$. An input terminal of the AND gate 57 is connected to the synchronous switching control circuit 100 to receive the oscillation signal $S_{TB}$. Another input terminal of the AND gate 57 is connected to an output terminal of a flip-flop 52. An output signal of the flip-flop 52 is enabled in response to the enable of the oscillation signal $S_{TB}$. A reset input terminal of the flip-flop 52 is connected to an output terminal of a comparator 53.

A positive input terminal and a negative input terminal of the comparator 53 are coupled to the feedback input terminal FB and an output terminal of an adder 55 to receive the feedback signal $V_{FB}$ and a saw-tooth signal $V_{SAW}$ respectively. The saw-tooth signal $V_{SAW}$ is generated from the adder 55 by adding the current signal $V_I$ with the ramp signal RAMP. Therefore, the output signal of the flip-flop 52 is disabled once the saw-tooth signal $V_{SAW}$ is higher than the feedback signal $V_{FB}$. The ramp signal RAMP provides the slope compensation to stabilize the feedback loop. The "Adaptive slope compensator for current mode power converters" by Yang, U.S. Pat. No. 5,903,452 described the skill of slope compensation for the control loop.

Figure 3:
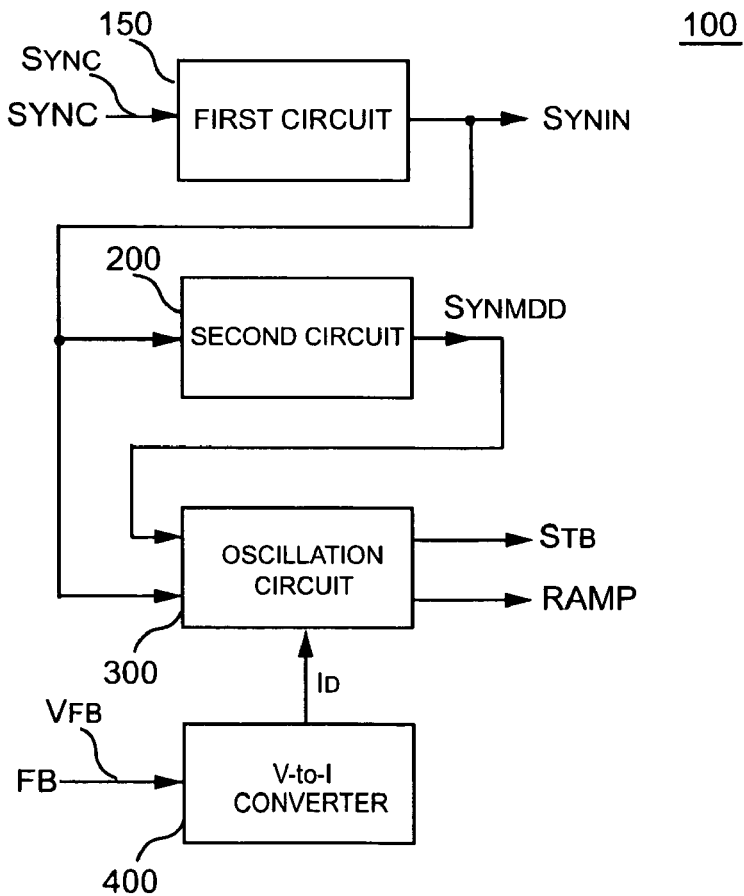
FIG. 3 shows a circuit diagram of a synchronous switching control circuit of the PWM control circuit according to one embodiment of the present invention.

As shown in FIG. 3, the synchronous switching control circuit 100 comprises a first circuit 150 coupled to the synchronous input terminal SYNC to receive the input synchronous signal $S_{YNC}$ for generating a first signal $S_{YNIN}$ in response to the leading edge of the input synchronous signal $S_{YNC}$. The input synchronous signal $S_{YNC}$ is the switching signal $V_{G1}$. The first signal $S_{YNIN}$ is produced as one-shot pulse. A second circuit 200 is coupled to an output terminal of the first circuit 150 to receive the first signal $S_{INN}$ to generate a second signal $S_{YNMOD}$ in accordance with the frequency of the first signal $S_{YNIN}$. The enable of the second signal $S_{YNMOD}$ indicates the first signal $S_{YNIN}$ is operated in a specific frequency range, which the synchronous operation is allowed.

An oscillation circuit 300 is coupled to the output terminals of the first circuit 150 and the second circuit 200 to receive the first signal $S_{YNIN}$ and the second signal $S_{YNMOD}$ to generate the oscillation signal $S_{TB}$ and the ramp signal RAMP. A V-to-I converter 400 is coupled to the feedback input terminal FB to generate a discharge current $I_D$ in accordance with the feedback signal $V_{FB}$. The discharge current $I_D$ is used in the oscillation circuit 300 to produce the oscillation signal $S_{TB}$. The switching frequency of the oscillation signal $S_{TB}$ is proportional to the discharge current $I_D$. Besides, the discharge current $I_D$ is decreased in response to the decrease of the feedback signal $V_{FB}$. The oscillation signal $S_{TB}$ is used to enable the switching signal $V_G$. Therefore, the switching frequency of the oscillation signal $S_{TB}$ and the switching signal $V_G$ will be decreased at light load for power saving.

The energy E stored by the transformer 25 can be expressed as, $$\varepsilon = \frac{1}{2} \times L_P \times I_P^2 = P \times T \qquad (1)$$

where $I_P$ can be expressed by, $$I_P = \frac{V_{IN}}{L_P} \times T_{ON} \qquad (2)$$

wherein $L_P$ is the inductance of the primary winding of the transformer 25, $I_P$ is the switching current of the transformer 25, P is the power of the second power converter 9, T is the switching period of the switching signal $V_G$, $V_{IN}$ is the input voltage applied to the transformer 25, $T_{ON}$ is an on-time of the switching signal $V_G$.

In accordance with equations (1) and (2), the power P can be expressed as, $$P = \frac{V_{IN}^2 \times T_{ON}^2}{2 \times L_P \times T} \qquad (3)$$

So as to ensure the proper operation of two power converters 5 and 9, a major concern for the synchronous switching is the switching frequency of the power converter. The power transferred through the transformer 25 to the output terminal of the second power converter 9 is controlled by the switching period T and on time $T_{ON}$ of the switching signal $V_G$.

Normally, the maximum on time of the switching signal $V_{G1}$ is limited for preventing the saturation of the magnetic device when the switching frequency of the switching signal $V_{G1}$ is decreased in response to the decrease of the load. However, this function might cause problem for the switching signal synchronization. The power converter will be unable to deliver sufficiency power to the load when the frequency of the input synchronous signal $S_{YNC}$ is low. The input synchronous signal $S_{YNC}$ is the switching signal $V_{G1}$. Therefore, to limit the minimum switching frequency of the input synchronous signal $S_{YNC}$ is required. Furthermore, the maximum switching frequency of the input synchronous signal $S_{YNC}$ is also need to be restricted in order to stabilize the feedback loop. Because insufficient slope compensation might be occurred if the PWM control circuit 50 operates at a higher switching frequency.

The second circuit 200 is developed to detect the frequency range of the first signal $S_{YNIN}$, and enable the synchronous operation when the frequency of the first signal $S_{YNIN}$ is higher than a first threshold and lower than a second threshold. The frequency of the second threshold is higher than the frequency of the first threshold. The oscillation signal $S_{TB}$ is therefore synchronized with the first signal $S_{INN}$ in response to the enable of the second signal $S_{YNMOD}$. The oscillation signal $S_{TB}$ is free running once the second signal $S_{YNMOD}$ is disabled.

Figure 4:
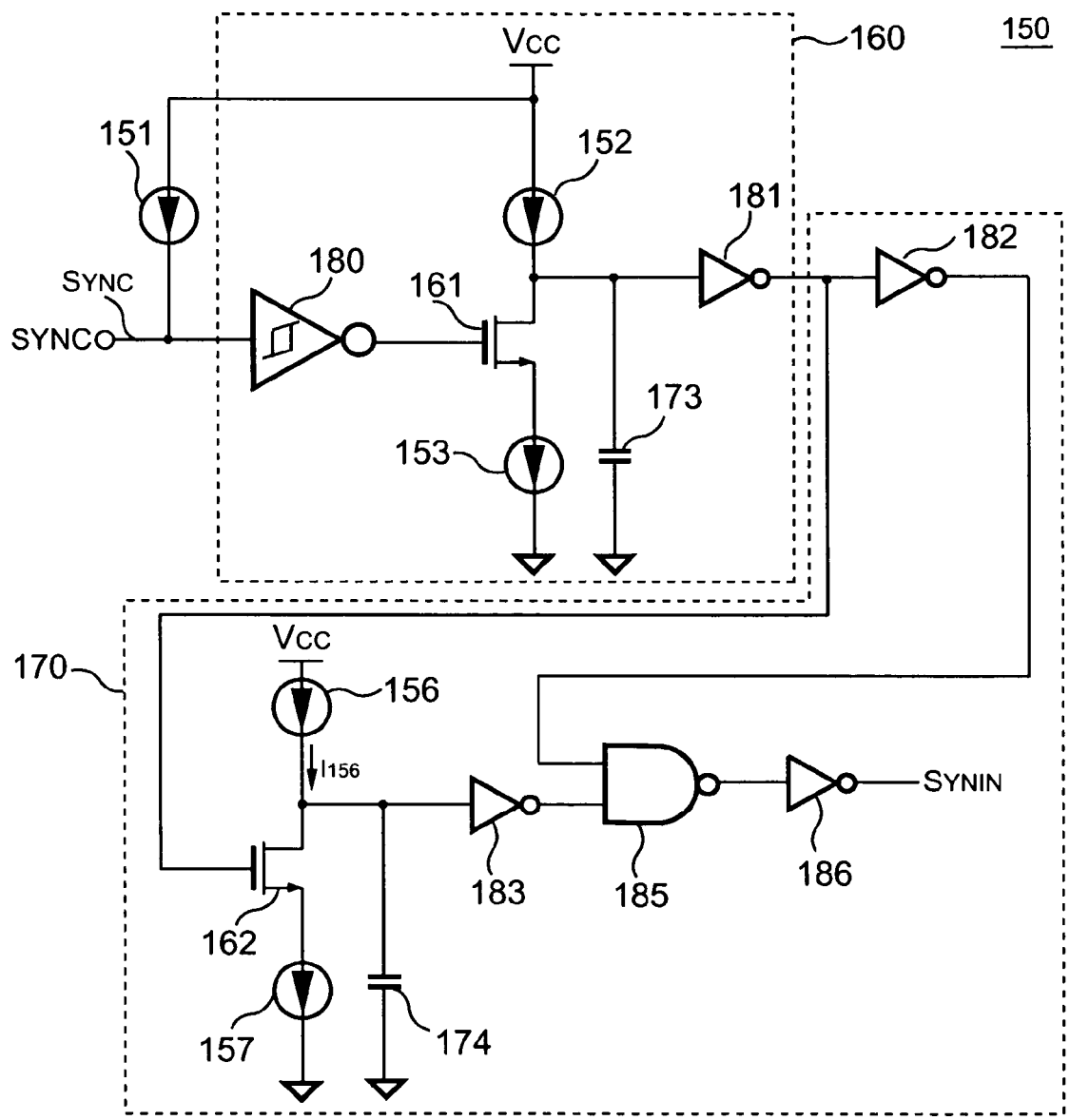
FIG. 4 shows a circuit diagram of a first circuit of the synchronous switching control circuit according to one embodiment of the present invention.

The circuit diagram of the first circuit 150 is shown in FIG. 4. A current source 151 is connected between the synchronous input terminal $S_{YNC}$ and the supply voltage $V_{CC}$ to pull high the input synchronous signal $S_{YNC}$. A debounce circuit 160 includes a transistor 161, a capacitor 173, current sources 152, 153 and inverters 180, 181 to filter the input noise and provide a propagation delay to the input synchronous signal $S_{YNC}$ which is the switching signal $V_{G1}$. The debounce circuit 160 is coupled to the synchronous input terminal SYNC to receive the input synchronous signal $S_{YNC}$ and generate an input signal in accordance with the input synchronous signal $S_{YNC}$. The current source 152 is coupled between the supply voltage $V_{CC}$ and the capacitor 173 to charge the capacitor 173. A drain of the transistor 161 is coupled to the capacitor 173. The current source 153 is coupled between a source of the transistor 161 and the ground to discharge the capacitor 173 via the transistor 161. A gate of the transistor 161 is coupled to an output terminal of the inverter 180. An input terminal of the inverter 180 is connected to the synchronous input terminal SYNC. An input terminal of the inverter 181 is coupled to the capacitor 173. An output terminal of the inverter 181 generates the input signal.

A one-shot circuit 170 comprises a transistor 162, a capacitor 174, a NAND gate 185, current sources 156, 157 and inverters 182, 183, 186. An input terminal of the inverter 182 and a gate of the transistor 162 are connected to the output terminal of the inverter 181 to receive the input signal. The current source 156 is coupled between the supply voltage $V_{CC}$ and the capacitor 174 to charge the capacitor 174. A drain of the transistor 162 is connected to the capacitor 174. The current source 157 is coupled between the ground and a source of the transistor 162 to discharge the capacitor 174 through the transistor 162. The inverter 183 is coupled between the capacitor 174 and an input terminal of the NAND gate 185. Another input terminal of the NAND gate 185 is coupled to an output terminal of the inverter 182. An output terminal of the NAND gate 185 is connected to an input terminal of the inverter 186. An output terminal of the inverter 186 generates the first signal $S_{YNIN}$. The one-shot circuit 170 is coupled to the output terminal of the debounce circuit 160 to receive the input signal to generate the first signal $S_{YNIN}$ in response to the rising edge of the input signal. The current $I_{156}$ of the current source 156 and the capacitance of the capacitor 174 determine the pulse width of the first signal $S_{YNIN}$. The pulse width of the first signal $S_{YNIN}$ is decided to be shorter than the pulse width of the input signal.

Figure 5:
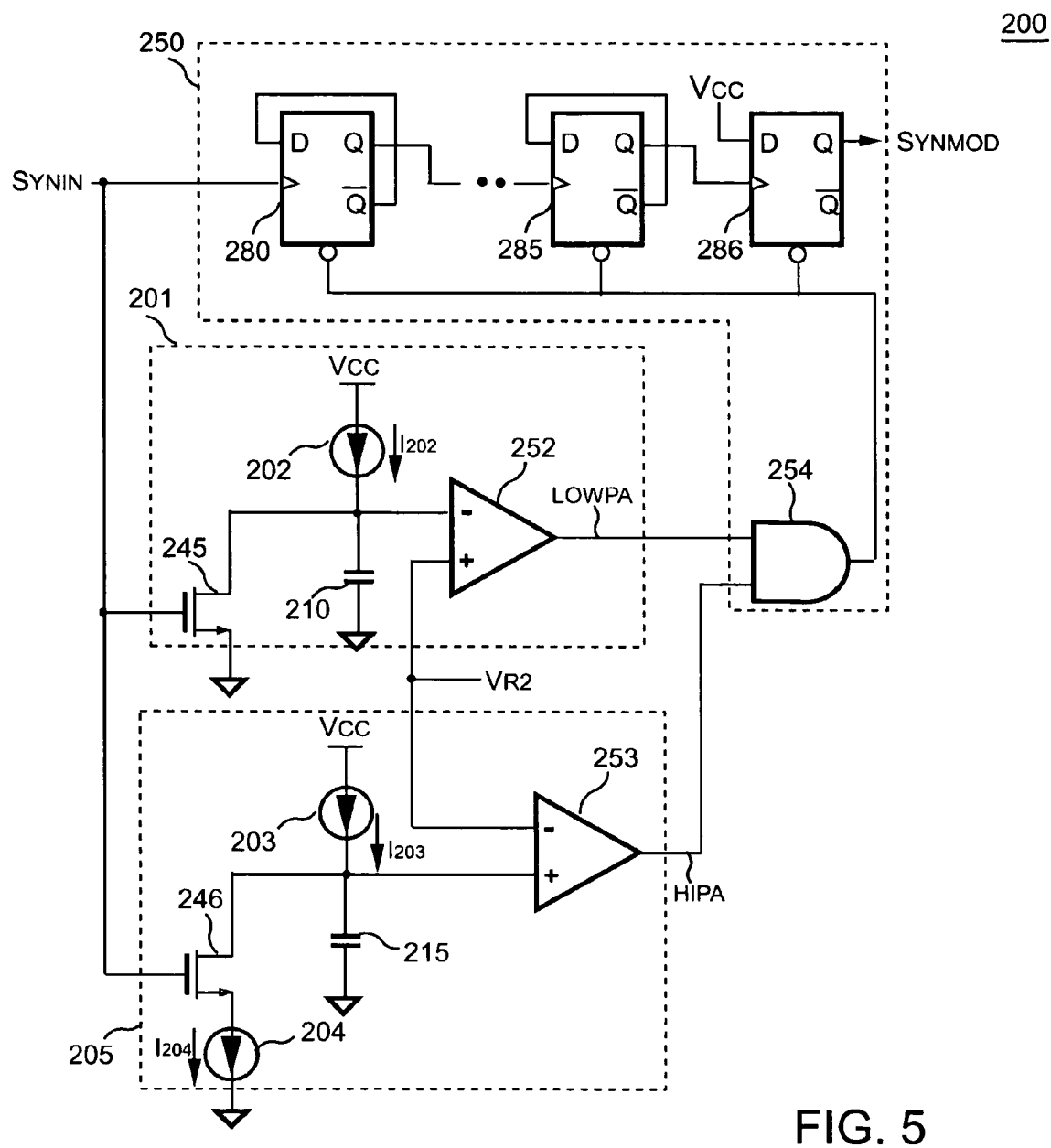
FIG. 5 shows a circuit diagram of a second circuit of the synchronous switching control circuit according to one embodiment of the present invention.

FIG. 5 shows the circuit diagram of the second circuit 200, it comprises a first timer 201, a second timer 205 and a counter 250. The first timer 201 includes a transistor 245, a capacitor 210, a current source 202 and a comparator 252. A gate of the transistor 245 receives the first signal $S_{YNIN}$. A source and a drain of the transistor 245 are coupled to the ground and the capacitor 210 respectively. The current source 202 is coupled to the supply voltage $V_{CC}$. The capacitor 210 is coupled between the current source 202 and the ground. The capacitor 210 is charged by the current source 202. A reference voltage $V_{R2}$ supplies to a positive input terminal of the comparator 252. A negative input terminal of the comparator 252 is coupled to the capacitor 210. An output terminal of the comparator 252 generates a low-pass signal LOWPA. The first timer 201 receives the first signal $S_{YNIN}$ to detect the frequency of the first signal $S_{YNIN}$. The first timer 201 will generate the low-pass signal LOWPA once the frequency of the first signal $S_{YNIN}$ is higher than the first threshold. The reference voltage $V_{R2}$, the current $I_{202}$ of the current source 202 and the capacitance $C_{210}$ of the capacitor 210 determine the period $T_1$ of the first threshold. It can be expressed as, $$T_1 = \frac{C_{210} \times V_{R2}}{I_{202}} \quad (4)$$

The second timer 205 includes a transistor 246, a capacitor 215, current sources 203, 204 and a comparator 253. The reference voltage $V_{R2}$ is connected to a negative input terminal of the comparator 253. The current source 203 is connected between the supply voltage $V_{CC}$ and the capacitor 215 to charge the capacitor 215. A drain of the transistor 246 is coupled to the capacitor 215. The current source 204 is coupled between the ground and a source of the transistor 246 to discharge the capacitor 215 through the transistor 246. The capacitor 215 is further connected to a positive input terminal of the comparator 253. A gate of the transistor 246 of the second timer 205 receives the first signal $S_{YNIN}$ to detect the frequency of the first signal $S_{YNIN}$. The second timer 205 will therefore generate a high-pass signal HIPA at an output terminal of the comparator 253 once the frequency of the first signal $S_{YNIN}$ is lower than the second threshold. The reference voltage $V_{R2}$, the capacitance $C_{215}$ of the capacitor 215 and the current $I_{203}$, $I_{204}$ of current sources 203, 204 determine the period $T_2$ of the second threshold.

The counter 250 comprises a plurality of flip-flops 280~286 and an AND gate 254. The flip-flops 280~286 are coupled in series with each other. The low-pass signal LOWPA and the high-pass signal HIPA are connected to input terminals of the AND gate 254. An output terminal of the AND gate 254 is connected to each reset terminal of the flip-flops 280~286. The counter 250 receives the first signal $S_{YNIN}$ to count the first signal $S_{YNIN}$ for generating the second signal $S_{YNMOD}$ once the low-pass signal LOWPA and the high-pass signal HIPA are enabled. The second signal $S_{YNMOD}$ is disabled when the low-pass signal LOWPA or the high-pass signal HIPA is disabled.

Figure 6:
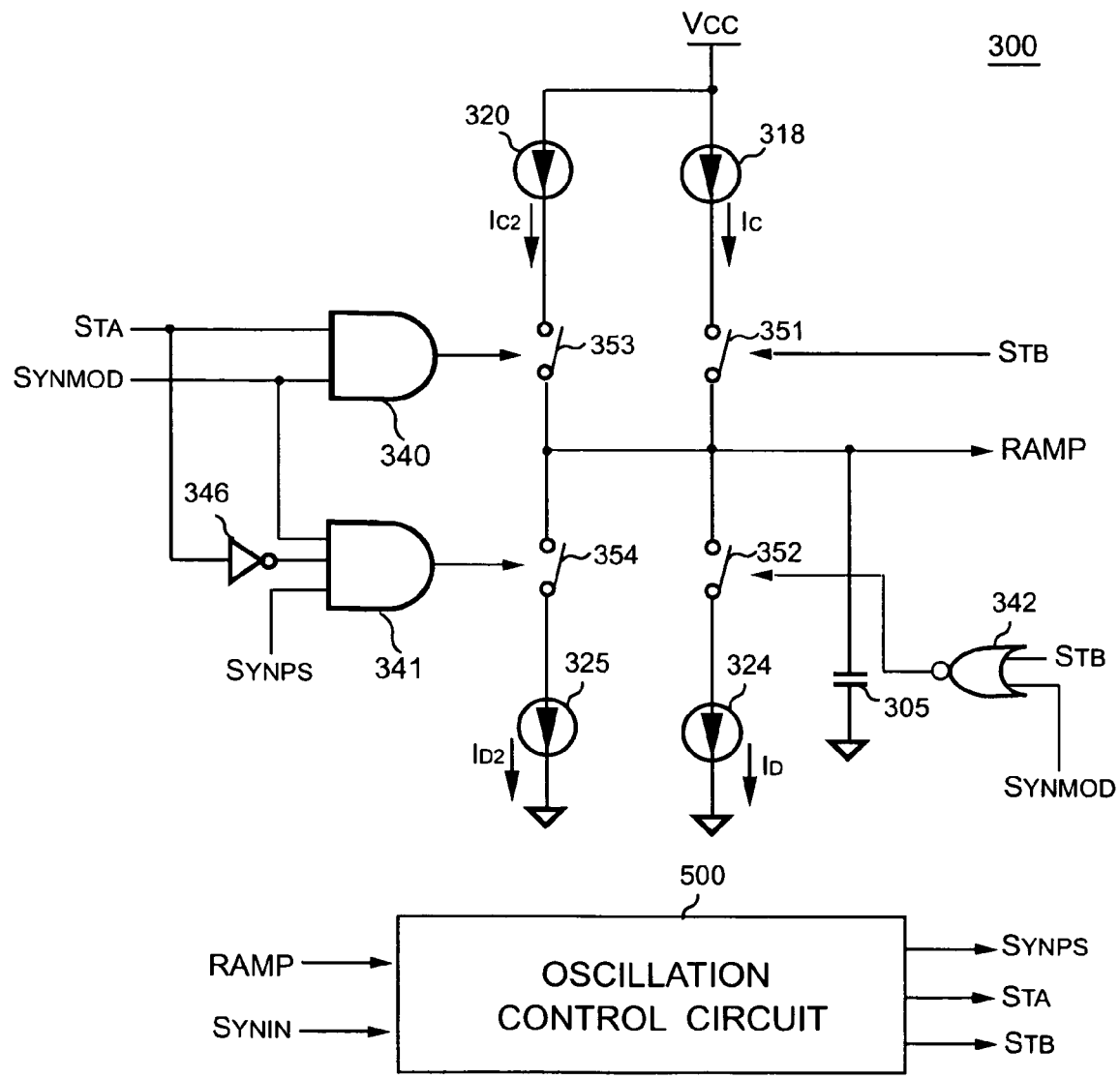
FIG. 6 shows a circuit diagram of an oscillation circuit of the synchronous switching control circuit according to one embodiment of the present invention.

FIG. 6 shows the circuit diagram of the oscillation circuit 300. A capacitor 305 is used for generating the ramp signal RAMP. A first charge current source 318 is coupled to the supply voltage $V_{CC}$. A switch 351 is coupled between the first charge current source 318 and the capacitor 305. A switch 352 is coupled between the first discharge current source 324 and the capacitor 305. A first charge current $I_C$ of the first charge current source 318 and the first discharge current $I_D$ of the first discharge current source 324 are coupled to the capacitor 305 through the switch 351 and the switch 352 respectively. A second charge current source 320 and a second discharge current source 325 are coupled to the supply voltage $V_{CC}$ and the ground respectively. A switch 353 is coupled between the second charge current source 320 and the capacitor 305. A switch 354 is coupled between the second discharge current source 325 and the capacitor 305. A second charge current $I_{C2}$ of the second charge current source 320 and a second discharge current $I_{D2}$ of the second discharge current source 325 are coupled to the capacitor 305 via the switch 353 and the switch 354 correspondingly.

An oscillation control circuit 500 is coupled to the capacitor 305 and the first circuit 150 to generate the oscillation signal $S_{TB}$, a sync-charge signal $S_{TA}$ and a sync-discharge signal $S_{YNPS}$ in response to the ramp signal RAMP, the first signal $S_{YNIN}$ and the second signal $S_{YNMOD}$. The switch 351 is controlled by the oscillation signal $S_{TB}$. The oscillation signal $S_{TB}$ and the second signal $S_{YNMOD}$ are transmitted to the input terminals of an NOR gate 342 to enable the switch 352. The sync-charge signal $S_{T4}$ and the second signal $S_{YNMOD}$ are transmitted to the input terminals of an AND gate 340 to enable the switch 353. The sync-charge signal $S_{T4}$ is further transmitted to an input terminal of an inverter 346. An output terminal of the inverter 346 is connected to a first input terminal of an AND gate 341. A second input terminal and a third input terminal of the AND gate 341 receive the sync-discharge signal $S_{YNPS}$ and the second signal $S_{YNMOD}$. Therefore, the oscillation signal $S_{TB}$ is used to enable the first charge current $I_C$ for charging the capacitor 305. The first discharge current $I_D$ is enabled for discharging the capacitor 305 when the oscillation signal $S_{TB}$ and the second signal $S_{YNMOD}$ are disabled. The second charge current $I_{C2}$ is enabled for charging the capacitor 305 in response to the enable of the sync-charge signal $S_{T4}$ and the enable of the second signal $S_{YNMOD}$. The second discharge current $I_{D2}$ is enabled for discharging the capacitor 305 in response to the enable of the sync-discharge signal $S_{YNPS}$, the enable of the second signal $S_{YNMOD}$ and the disable of the sync-charge signal $S_{T4}$.

Figure 7:
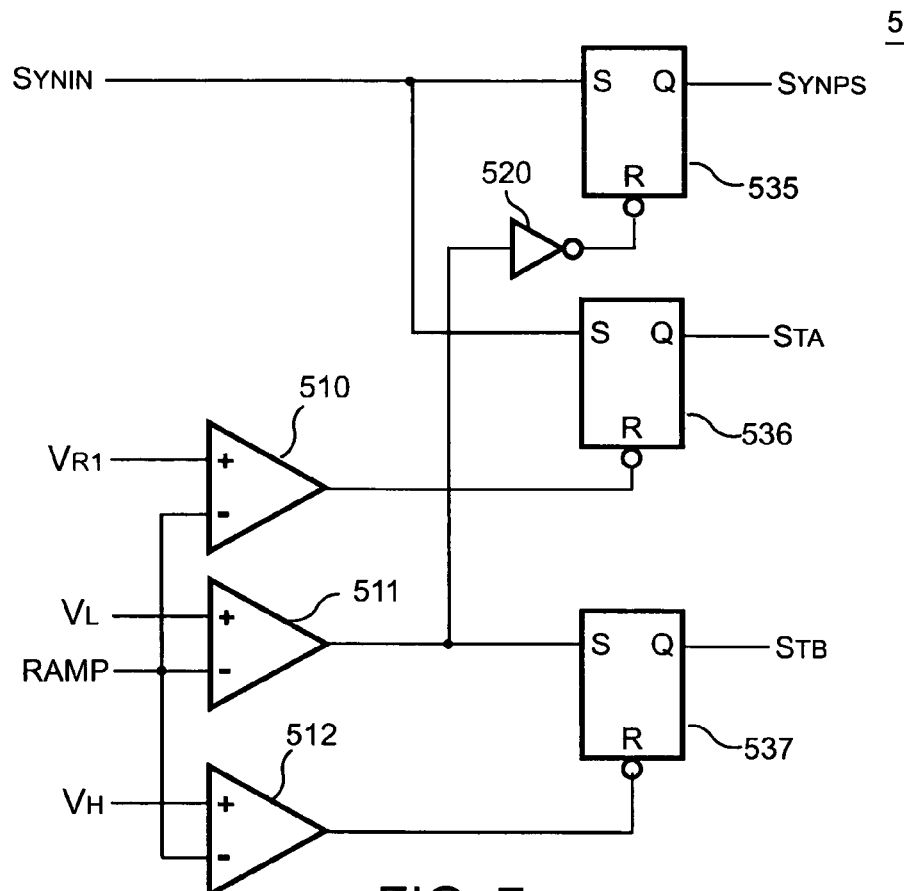
FIG. 7 shows a circuit diagram of an oscillation control circuit of the oscillation circuit according to one embodiment of the present invention.

The circuit diagram of the oscillation control circuit 500 is shown in FIG. 7. The ramp signal RAMP is transmitted to each negative input terminal of the comparators 510, 511 and 512. The positive input terminals of the comparators 510, 511 and 512 receive the trip-point voltages $V_{R1}$, $V_L$ and $V_H$ respectively. An output terminal of the comparator 510 is connected to a reset input terminal of a third flip-flop 536 to reset the third flip-flop 536. The comparator 511 is applied to set a first flip-flop 537. The comparator 511 is further applied to reset a second flip-flop 535 through an inverter 520. An output terminal of the comparator 511 is coupled to a set input terminal of the first flip-flop 537 and an input terminal of the inverter 520. An output terminal of the inverter 520 is coupled to a reset input terminal of the second flip-flop 535 to reset the second flip-flop 535. The first signal $S_{YNIN}$ is transmitted to the set input terminals of the second flip-flop 535 and the third flip-flop 536 to set the second flip-flop 535 and the third flip-flop 536. The comparator 512 is coupled to a reset input terminal of the first flip-flop 537 to reset the first flip-flop 537. The first flip-flop 537 is applied to generate the oscillation signal $S_{TB}$. The oscillation signal $S_{TB}$ is enabled when the ramp signal RAMP is lower than the first trip-point voltage $V_L$. The oscillation signal $S_{TB}$ is disabled when the ramp signal RAMP is higher than the second trip-point voltage $V_H$. The second flip-flop 535 is utilized to generate the sync-discharge signal $S_{YNPS}$. The sync-discharge signal $S_{YNPS}$ is enabled in response to the enable of the first signal $S_{YNIN}$. The sync-discharge signal $S_{YNPS}$ is disabled when the ramp signal RAMP is lower than the first trip-point voltage $V_L$. The third flip-flop 536 is applied to generate the sync-charge signal $S_{T4}$. The sync-charge signal $S_{T4}$ is enabled in response to the enable of the first signal $S_{YNIN}$. The sync-charge signal $S_{T4}$ is disabled when the ramp signal RAMP is higher than the third trip-point voltage $V_{R1}$. The third trip-point voltage $V_{R1}$ is higher than the second trip-point voltage $V_H$. The second trip-point voltage $V_H$ is higher than the first trip-point voltage $V_L$. Therefore, the oscillation signal $S_{TB}$ is generated after the generation of the first signal $S_{YNIN}$ when the second signal $S_{YNMOD}$ is enabled.

The waveforms of the ramp signal RAMP and the oscillation signal $S_{TB}$ under the switching signal $V_G$ is free running are shown in FIGS. 9A and 9B. FIGS. 9C and 9D show the waveforms of the ramp signal RAMP and the sync-discharge signal $S_{YNPS}$ under the switching signal $V_G$ is synchronized with the input synchronous signal $S_{YNC}$ which is the switching signal $V_{G1}$. The ramp signal RAMP is synchronized with the sync-discharge signal $S_{YNPS}$. The waveforms of FIGS. 9B and 9D show the second power converter 9 is operated at the power saving mode, in which the switching frequency is reduced.

Figure 8:
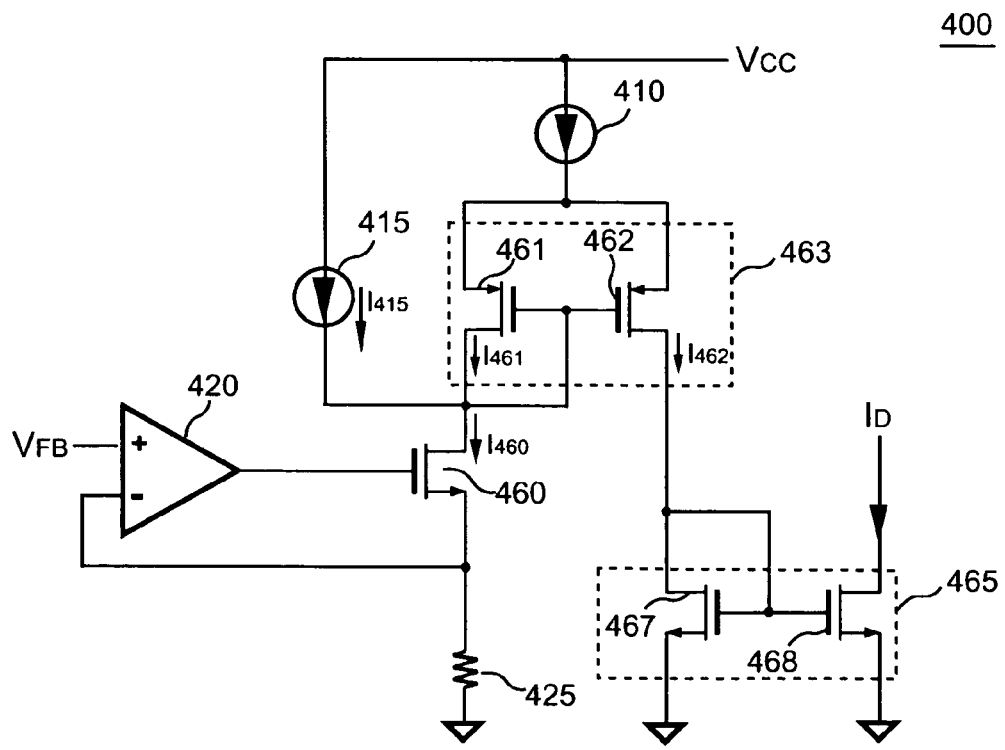
FIG. 8 shows a circuit diagram of a V-to-I converter of the synchronous switching control circuit according to one embodiment of the present invention.

FIG. 8 shows the circuit diagram of the V-to-I converter 400 that is used for generating the first discharge current $I_D$. A positive input terminal of an operational amplifier 420 receives the feedback signal $V_{FB}$. A negative input terminal of the operational amplifier 420 is coupled to a source of a transistor 460. An output terminal of the operational amplifier 420 is coupled to a gate of the transistor 460. A drain of the transistor 460 outputs a current $I_{460}$. A resistor 425 is coupled between the source of the transistor 460 and the ground. The operational amplifier 420, the transistor 460 and the resistor 425 generate the current $I_{460}$ in response to the feedback signal $V_{FB}$. The current $I_{460}$ is decreased in accordance with the decrease of the feedback signal $V_{FB}$.

A first current mirror 463 includes transistors 461 and 462. The sources of the transistors 461, 462 are coupled to a current source 410. The current source 410 is further coupled to the supply voltage $V_{CC}$. The gates of the transistors 461, 462 and the drains of the transistors 460,461 are connected together. A current source 415 is coupled between the drain of the transistor 460 and the supply voltage $V_{CC}$. A second current mirror 465 includes transistors 467 and 468. The gates of the transistors 467, 468 and the drains of the transistors 462, 467 are coupled together. The sources of the transistors 467, 468 are coupled to the ground. The drain of the transistors 468 generates the first discharge current $I_D$. The current $I_{460}$ subtracts a current $I_{415}$ of a current source 415 produce a current $I_{461}$ transmitted to the first current mirror 463. The first current mirror 463 produces a current $I_{462}$ in response to the current $I_{461}$. The maximum current of the current $I_{462}$ is limited by the current source 410. The current $I_{462}$ is transmitted to the second current mirror 465 to produce the first discharge current $I_D$. The maximum current of the first discharge current $I_D$ is thus limited. Besides, the first discharge current $I_D$ is decreased in response to the decrease of the feedback signal $V_{FB}$ for power saving.

While the present invention has been particularly shown and described with reference to preferred embodiments thereof, it will be understood by those of ordinary skill in the art that various changes in form and details may be made therein without departing from the spirit and scope of the present invention as defined by the appended claims.

What is claimed is:

1. A synchronous switching control circuit comprising:
a first circuit generating a first signal at an output thereof in response to an input synchronous signal;
a second circuit coupled to the output of the first circuit to generate a second signal at an output thereof in accordance with a frequency of the first signal; and
an oscillation circuit coupled to the output of the first circuit and the output of the second circuit to generate an oscillation signal in accordance with the first signal and the second signal;
wherein the oscillation signal is utilized to enable a switching signal of a power converter, the switching signal is utilized to switch a transformer of the power converter, the oscillation signal is synchronized with the input synchronous signal in response to the second signal being enabled, the oscillation signal is free running once the second signal is disabled.

2. The synchronous switching control circuit as claimed in claim 1, wherein the second signal is enabled when the frequency of the first signal is higher than a first threshold and lower than a second threshold, in which the second threshold is higher than the first threshold.

3. The synchronous switching control circuit as claimed in claim 1, wherein the oscillation signal is generated after the generation of the first signal when the second signal is enabled.

4. The synchronous switching control circuit claimed in claim 1, wherein the second circuit comprising:
a first timer receiving the first signal to detect the frequency of the first signal, in which the first timer generates a low-pass signal once the frequency of the first signal is higher than a first threshold;
a second timer receiving the first signal to detect the frequency of the first signal, in which the second timer generates a high-pass signal once the frequency of the first signal is lower than a second threshold, wherein the second threshold is higher than the first threshold; and
a counter receiving the first signal, the low-pass signal and the high-pass signal to count the first signal for generating the second signal once the low-pass signal and the high-pass signal are enabled, in which the second signal is disabled when the low-pass signal or the high-pass signal is disabled.

5. The synchronous switching control circuit as claimed in claim 1, wherein the oscillation circuit comprising:
a capacitor generating a ramp signal;
a first charge current coupled to the capacitor;
a first discharge current coupled to the capacitor;
a second charge current coupled to the capacitor;
a second discharge current coupled to the capacitor; and
an oscillation control circuit coupled to the capacitor and the first circuit to generate the oscillation signal, a sync-charge signal and a sync-discharge signal in response to the ramp signal and the first signal;
wherein the oscillation signal is used to enable the first charge current for charging the capacitor, the first discharge current is enabled for discharging the capacitor when the oscillation signal and the second signal are disabled, the second charge current is enabled for charging the capacitor in response to the enable of the sync-charge signal and the enable of the second signal, the second discharge current is enabled for discharge the capacitor in response to the enable of the sync-discharge signal, the enable of the second signal and the disable of the sync-charge signal.

6. The synchronous switching control circuit as claimed in claim 5, wherein the oscillation control circuit comprising:
a first flip-flop generating the oscillation signal, in which the oscillation signal is enabled when the ramp signal is lower than a first trip-point voltage, the oscillation signal is disabled when the ramp signal is higher than a second trip-point voltage;
a second flip-flop generating the sync-discharge signal, in which the sync-discharge signal is enabled in response to the enable of the first signal, the sync-discharge signal is disabled when the ramp signal is lower than the first trip-point voltage; and
a third flip-flop generating the sync-charge signal, in which the sync-charge signal is enabled in response to the enable of the first signal, the sync-charge signal is disabled when the ramp signal is higher than a third trip-point voltage;
wherein the third trip-point voltage is higher than the second trip-point voltage, the second trip-point voltage is higher than the first trip-point voltage.

7. A synchronous switching control circuit comprising:
a first circuit generating a first signal in response to an input synchronous signal, the first circuit including:
a debounce circuit receiving the input synchronous signal and generating an input signal in accordance with input synchronous signal; and
a one-shot circuit coupled to the debounce circuit to generate the first signal in response to the a rising edge of the input signal, in which a pulse width of the first signal is shorter than a pulse width of the input signal;
a second circuit coupled to the first circuit to generate a second signal in accordance with the frequency of the first signal;
an oscillation circuit coupled to the first circuit and the second circuit to generate an oscillation signal in accordance with the first signal and the second signal, the oscillation signal being utilized to enable a switching signal of a power converter,
wherein the oscillation signal is utilized to enable a switching signal of a power converter, the switching signal is utilized to switch a transformer of the power converter, the oscillation signal is synchronized with the input synchronous signal in response to the second signal being enabled, the oscillation signal is free running once the second signal is disabled.

8. A synchronous switching control circuit comprising:
a first circuit generating a first signal in response to an input synchronous signal;
a second circuit coupled to the first circuit to generate a second signal in accordance with the frequency of the first signal;
an oscillation circuit coupled to the first circuit and the second circuit to generate an oscillation signal in accordance with the first signal and the second signal, the oscillation signal being utilized to enable a switching signal of a power converter, the switching signal being utilized to switch a transformer of the power converter, the oscillation signal being synchronized with the input synchronous signal in response to the second signal being enabled, the oscillation signal being free running once the second signal is disabled; and
a V-to-I converter coupled to the oscillation circuit, wherein the V-to-I converter receives a feedback signal of the power converter to generate a discharge current transmitted to the oscillation circuit for generating the oscillation signal.

* * * * *